United States Patent
Noji et al.

(10) Patent No.: US 6,869,890 B2
(45) Date of Patent: Mar. 22, 2005

(54) PROCESSING APPARATUS TO BE SEALED AGAINST WORKPIECE

(75) Inventors: Nobuharu Noji, Tokyo (JP); Hiroshi Sobukawa, Tokyo (JP); Masami Nagayama, Tokyo (JP); Koji Ono, Tokyo (JP); Mutsumi Saito, Tokyo (JP)

(73) Assignee: Ebara Corporation, Tokyo (JP)

( * ) Notice: Subject to any disclaimer, the term of this patent is extended or adjusted under 35 U.S.C. 154(b) by 342 days.

(21) Appl. No.: 10/034,373

(22) Filed: Jan. 3, 2002

(65) Prior Publication Data

US 2002/0088399 A1 Jul. 11, 2002

(30) Foreign Application Priority Data

Jan. 9, 2001 (JP) .................................... 2001-001831

(51) Int. Cl.[7] .............................................. H01L 21/31
(52) U.S. Cl. ........................ 438/758; 118/720; 451/39
(58) Field of Search ..................... 438/758; 118/720; 451/39

(56) References Cited

U.S. PATENT DOCUMENTS

| | | | | | |
|---|---|---|---|---|---|
| 5,997,963 A | * | 12/1999 | Davison et al. | ............. | 427/582 |
| 6,156,625 A | * | 12/2000 | Balamurugan | ............... | 438/462 |
| 6,187,134 B1 | * | 2/2001 | Chow et al. | ........... | 156/345.51 |
| 6,764,386 B2 | * | 7/2004 | Uziel | .......................... | 451/39 |
| 2002/0042246 A1 | * | 4/2002 | Togawa et al. | ............. | 451/288 |

* cited by examiner

*Primary Examiner*—W. David Coleman
(74) *Attorney, Agent, or Firm*—Wenderoth, Lind & Ponack, L.L.P.

(57) ABSTRACT

A processing apparatus is used for processing a workpiece such as a semiconductor wafer. The processing apparatus comprises a cover for covering a portion of a surface, to be processed, of a workpiece, a process chamber formed by the cover and the surface, to be processed, of the workpiece, and a sealing portion provided between the cover and the surface of the workpiece for sealing the process chamber.

10 Claims, 11 Drawing Sheets

F I G. 1 3
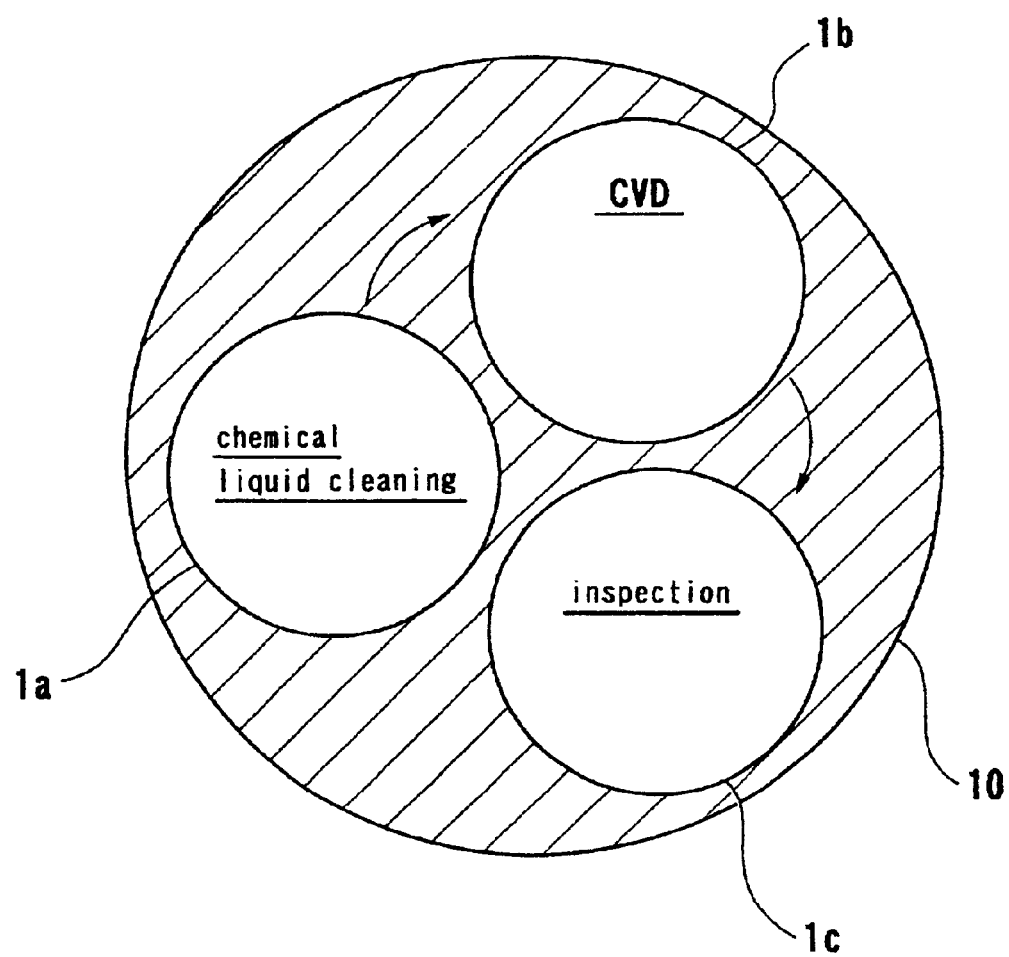

PROCESSING APPARATUS TO BE SEALED AGAINST WORKPIECE

BACKGROUND OF THE INVENTION

1. Field of the Invention

The present invention relates to a processing apparatus and method for processing a workpiece, and more particularly to a processing apparatus and method for processing a workpiece such as a semiconductor substrate, a glass substrate, and a crystal substrate.

2. Description of the Related Art

In a processing apparatus for processing various workpieces, a workpiece to be processed is held in a process chamber and processed under predetermined conditions in the process chamber. FIG. 15 is a conceptional plan view showing a relationship between a workpiece to be processed and a process chamber in a conventional processing apparatus. In the conventional processing apparatus, as shown in FIG. 15, a workpiece 10 is disposed in a process chamber 100 kept under predetermined conditions, and is then processed therein. Thus, the conventional processing apparatus requires a process chamber larger than the workpiece 10 in order to contain the workpiece 10 therein.

Semiconductor wafers, liquid crystal panels, or the like tend to become larger in size in accordance with the advance of the generation of technology. Therefore, for processing workpieces in these fields, such as semiconductor wafers, glass substrates, and crystal substrates, the process chamber of the processing apparatus becomes larger in size because of larger workpieces, resulting in a larger installation space for the processing apparatus.

SUMMARY OF THE INVENTION

The present invention has been made in view of the above drawbacks. It is therefore an object of the present invention to provide a processing apparatus and method for processing a workpiece which can reduce an installation space for the apparatus and an amount of a material required for the process, such as a process gas or a cleaning liquid.

In order to achieve the above object, according to the present invention, there is provided a processing apparatus which has a size smaller than a surface, to be processed, of a workpiece, as shown in FIG. 1. Specifically, according to a first aspect of the present invention, there is provided a processing apparatus for processing a workpiece, comprising: a cover for covering a portion of a surface, to be processed, of the workpiece; a process chamber formed by the cover and the surface, to be processed, of the workpiece; and a sealing portion provided between the cover and the surface of the workpiece for sealing the process chamber.

According to a second aspect of the present invention, there is provided a processing method for processing a workpiece, comprising: disposing on a surface, to be processed, of the workpiece, a processing apparatus comprising a cover for covering a portion of the surface, to be processed, of the workpiece, a process chamber formed by the cover and the surface, to be processed, of the workpiece, and a sealing portion provided between the cover and the surface of the workpiece for sealing the process chamber; and processing the surface of the workpiece in the process chamber.

According to the present invention, even if a workpiece to be processed becomes larger in size, it is not necessary to make a process chamber larger, and hence the processing apparatus has a highly compact structure to reduce an installation space for the apparatus and an amount of a material required for the process.

In this case, the sealing portion may comprise at least one of a contact seal and a non-contact seal. The contact seal may comprise at least one of an O-ring and an oil seal. The non-contact seal may comprise at least one of a magnetic fluid seal and a differential pumping seal (differential exhaust seal).

The processing apparatus may further comprise a chemical vapor deposition device in the process chamber for depositing a thin film on the surface of the workpiece. Alternatively, the processing apparatus may further comprise a chemical liquid cleaning device in the process chamber for cleaning the surface of the workpiece with a chemical liquid.

The processing apparatus may further comprise a sensor for detecting conditions of the surface of the workpiece. With this arrangement, conditions of the surface of the workpiece before or after performing a process can be detected for thereby diagnosing the process. Such diagnosis can be applied to a process for regenerating the surface of the workpiece or removing a defective workpiece.

In this case, the processing apparatus may further comprise an adjustment device for adjusting processing conditions in the process chamber by feedback control based on a signal from the sensor. With this arrangement, the surface of the workpiece can properly be processed based on the actual conditions of the surface of the workpiece before or after the process.

The surface of the workpiece may be processed under a pressure lower than atmospheric pressure, or processed under a wet condition.

Processing conditions in the process chamber may be changed for sequentially performing a plurality of processes. When processing conditions in the processing chamber are changed, a plurality of processes can sequentially be performed in one process chamber.

According to a preferred aspect of the present invention, a plurality of processing apparatuses are disposed on the workpiece, and a plurality of portions of the workpiece are simultaneously processed in the respective process chambers of the plurality of processing apparatuses. As described above, the processing apparatus according to the present invention has a size smaller than the surface, to be processed, of the workpiece, and hence the workpiece can be processed by a plurality of processing apparatuses. Therefore, a plurality of portions of the workpiece can substantially simultaneously be processed by a plurality of processing apparatuses.

In this case, a plurality of processes may be performed under different processing conditions in the respective process chambers of the plurality of processing apparatuses. If periods of time required for the respective processes in the process chambers are different from each other, then processing conditions are properly modified for the respective process chambers to control reaction rates in the respective process chambers. Thus, the periods of time required for the respective processes in the process chambers can properly be adjusted.

According to a preferred aspect of the present invention, the surface of the workpiece is processed while the process chamber is being moved relatively to the surface of the workpiece. With this method, the whole surface of the workpiece or only a desired area of the surface of the workpiece can be processed. In this case, the process chamber may continuously be moved relatively to the surface of the workpiece. Alternatively, the process chamber may intermittently be moved relatively to the surface of the workpiece for processing another portion of the surface of the workpiece.

The above and other objects, features, and advantages of the present invention will be apparent from the following description when taken in conjunction with the accompanying drawings which illustrates preferred embodiments of the present invention by way of example.

BRIEF DESCRIPTION OF THE DRAWINGS

FIG. 13 is a schematic plan view showing an example of performing different processes in a plurality of process chambers;

DETAILED DESCRIPTION OF THE PREFERRED EMBODIMENTS

A processing apparatus for processing a workpiece according to embodiments of the present invention will be described below with reference to the accompanying drawings.

Figure 1:
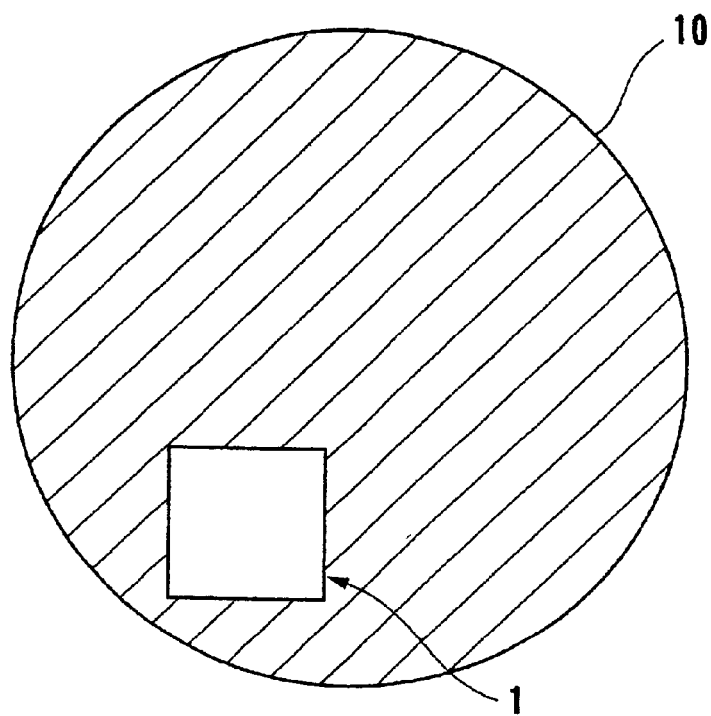
FIG. 1 is a conceptional plan view showing a relationship between a workpiece to be processed and a process chamber in a processing apparatus according to the present invention.
Figure 2:
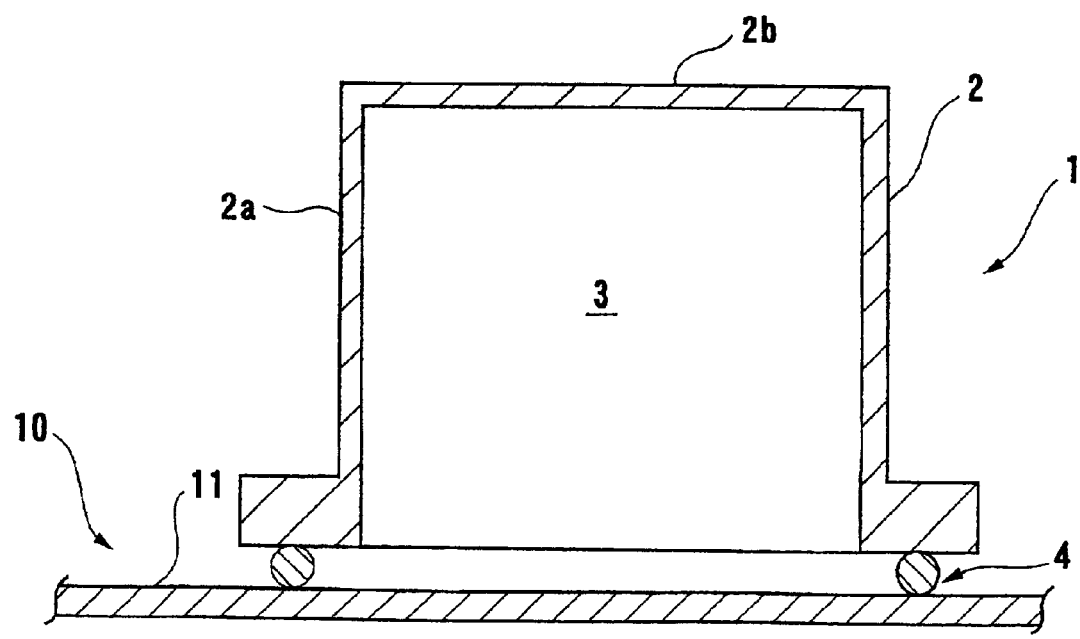
FIG. 2 is a vertical cross-sectional view schematically showing a processing apparatus according to an embodiment of the present invention.

FIG. 1 is a conceptional plan view showing a relationship between a workpiece to be processed and a process chamber in a processing apparatus according to the present invention, and FIG. 2 is a vertical cross-sectional view showing a processing apparatus for processing a workpiece according to an embodiment of the present invention. As shown in FIGS. 1 and 2, the processing apparatus 1 for processing a workpiece according to the present invention has a size smaller than a workpiece 10 to be processed. Specifically, in the plan view shown in FIG. 1, the processing apparatus 1 has an area smaller than a surface, to be processed, of the workpiece 10. The processing apparatus 1 comprises a rectangular parallelepiped receptacle-like cover 2 having four flat side walls 2a and a rectangular upper wall 2b for covering a portion of the surface 11, to be processed, of the workpiece 10. A process chamber 3 is formed within the cover 2 by the cover 2 and the surface 11 of the workpiece 10. The cover 2 has a sealing portion 4 provided at the lower end thereof for sealing the process chamber 3 between the lower end of the cover 2 and the surface 11 of the workpiece 10. In this embodiment, the cover 2 has a rectangular parallelepiped receptacle-like shape and comprises the four flat side walls 2a and the rectangular upper wall 2b. However, the cover is not limited to this shape, and may have a cylindrical receptacle-like shape and comprise a cylindrical side wall and a circular upper wall, for example. Alternatively, the cover may comprise a hexagonal upper wall and rectangular side walls, or a polygonal upper wall and rectangular side walls.

Generally, it is necessary to maintain desired processing conditions in a process chamber where a workpiece is processed. For example, the pressure in the process chamber is required to be lower than that in an exterior space in some cases, and the pressure in the process chamber is required to be higher than that in the exterior space in other cases. Further, the workpiece is processed with use of a reactive gas or a reactive liquid in some cases. Therefore, in order to maintain desired processing conditions in the process chamber, it is necessary to seal an interior of the process chamber from the outside space. In the processing apparatus according to the present invention, the cover 2 has the sealing portion 4 provided at the lower end thereof to seal the interior of the process chamber 3 from the exterior space. Various sealing mechanisms may be used as the sealing portion 4. For example, the sealing portion 4 may comprise a contact seal such as an O-ring or an oil seal, or a non-contact seal such as a magnetic fluid seal or a differential pumping seal.

Figure 3:
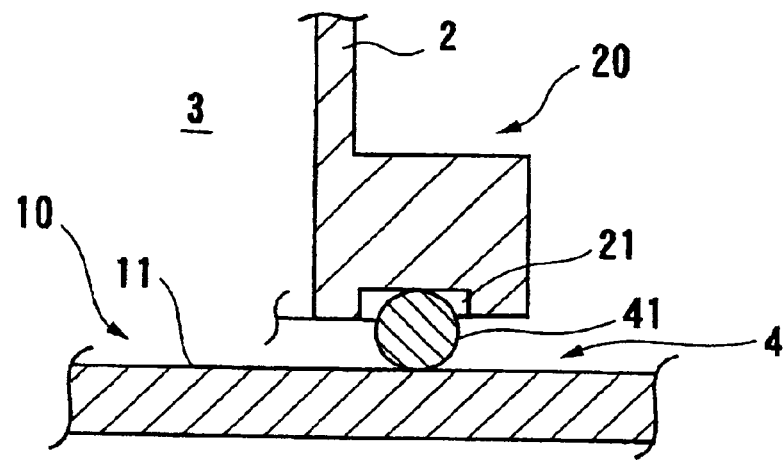
FIG. 3 is a schematic view showing an example of a sealing portion in the processing apparatus shown in FIG. 2.

FIG. 3 is a schematic view showing an example of the sealing portion 4 comprising an O-ring. As shown in FIG. 3, the cover 2 has a support portion 20 at the lower portion thereof, and a sealing groove 21 is formed in the lower surface of the support portion 20 (the lower end of the cover 2) so as to face the surface 11 to be processed. An O-ring 41 is fitted into the sealing groove 21 to seal the interior of the process chamber 3 from the exterior space. Thus, the interior of the process chamber 3 is kept hermetically sealed.

Figure 4:
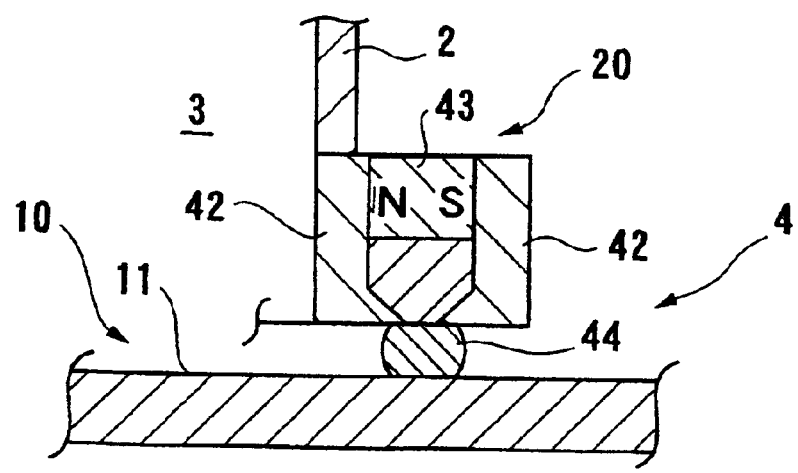
FIG. 4 is a schematic view showing another example of a sealing portion in the processing apparatus shown in FIG. 2.

FIG. 4 is a schematic view showing an example of the sealing portion 4 comprising a magnetic fluid seal. As shown in FIG. 4, the cover 2 has a support portion 20 comprising a pair of pole pieces 42 and a magnet 43 interposed between the pole pieces 42. The magnet 43 and the pole pieces 42 extend along the circumferential direction over a lower portion of the cover 2 in its entirety. A magnetic fluid 44 is injected into a space between the lower ends of the pole pieces 42 and the surface 11 to be processed. The magnetic fluid 44 is held in the space between the lower ends of the pole pieces 42 and the surface 11 due to a magnetic closed circuit (loop circuit) produced by the pole pieces 42 and the magnet 43. Thus, the interior of the process chamber 3 is sealed from the exterior space by the magnetic fluid 44.

Figure 5:
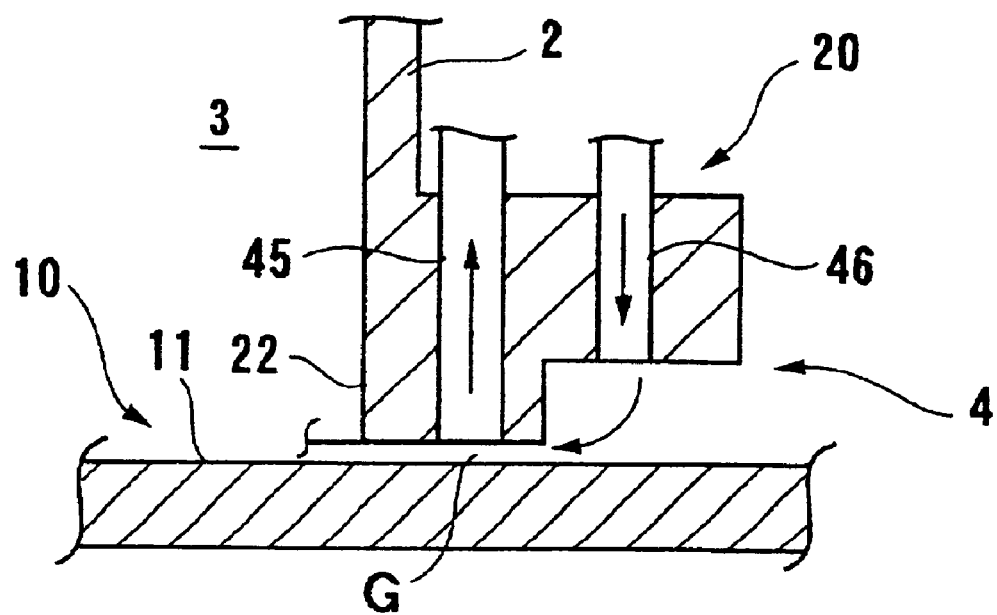
FIG. 5 is a schematic view showing still another example of a sealing portion in the processing apparatus shown in FIG. 2.

FIG. 5 is a schematic view showing an example of the sealing portion 4 comprising a differential pumping seal (differential exhaust seal). As shown in FIG. 5, the cover 2 has a support portion 20 having a projection 22 projecting downwardly therefrom. An exhaust passage 45 extending upwardly from the lower end of the projection 22 is formed in the support portion 20. The exhaust passage 45 is connected to a vacuum source (not shown) such as a vacuum pump. A gas supply passage 46 is formed in the support portion 20 at a radially outward position of the exhaust passage 45 and is connected to a gas supply source (not shown). The exhaust passage 45 and the gas supply passage 46 may extend along the circumferential direction over the entire lower portion of the cover 2. Alternatively, the exhaust passage 45 and the gas supply passage 46 may be connected to a plurality of openings formed in a lower surface of the cover 2. A sealing gas is supplied via the gas supply passage 46 into a gap G between the projection 22 and the surface 11 to be processed. The supplied sealing gas is exhausted via the exhaust passage 45 by the vacuum source. The interior of the process chamber 3 is sealed from the exterior space by a differential pressure between the pressure of the sealing gas supplied to the gap G and the pressure in the process chamber 3. Thus, the interior of the process chamber 3 is kept hermetically sealed.

At the beginning of processing, the cover 2 is downwardly moved relatively to the workpiece 10 by a lifting/lowering mechanism (not shown) provided on the cover 2, for thereby pressing the sealing portion 4 such as an O-ring against the surface 11 to be processed at a predetermined pressure. Alternatively, the cover 2 may downwardly be moved and positioned so as to produce a predetermined gap G between the sealing portion 4 and the surface 11 to be processed (see FIG. 5).

Various devices for performing respective processes for the workpiece 10 can be incorporated into the process chamber 3 sealed from the exterior space by the sealing portion 4. For example, in semiconductor fabrication processes and electronic component fabrication processes, devices for performing the following processes are provided as needed.

1) Processes under vacuum (for example, dry etching such as reactive ion etching (RIE), and sputtering, chemical vapor deposition (CVD), physical vapor deposition (PVD), baking, and drying)

2) Processes under atmospheric pressure (for example, lithography and drying)

3) Wet processes (for example, chemical liquid coating, wet etching, resist coating, plating, and chemical mechanical polishing (CMP))

4) Cleaning processes (for example, pure water cleaning, chemical liquid cleaning, ultrasonic cleaning, and scrubbing)

Figure 6:
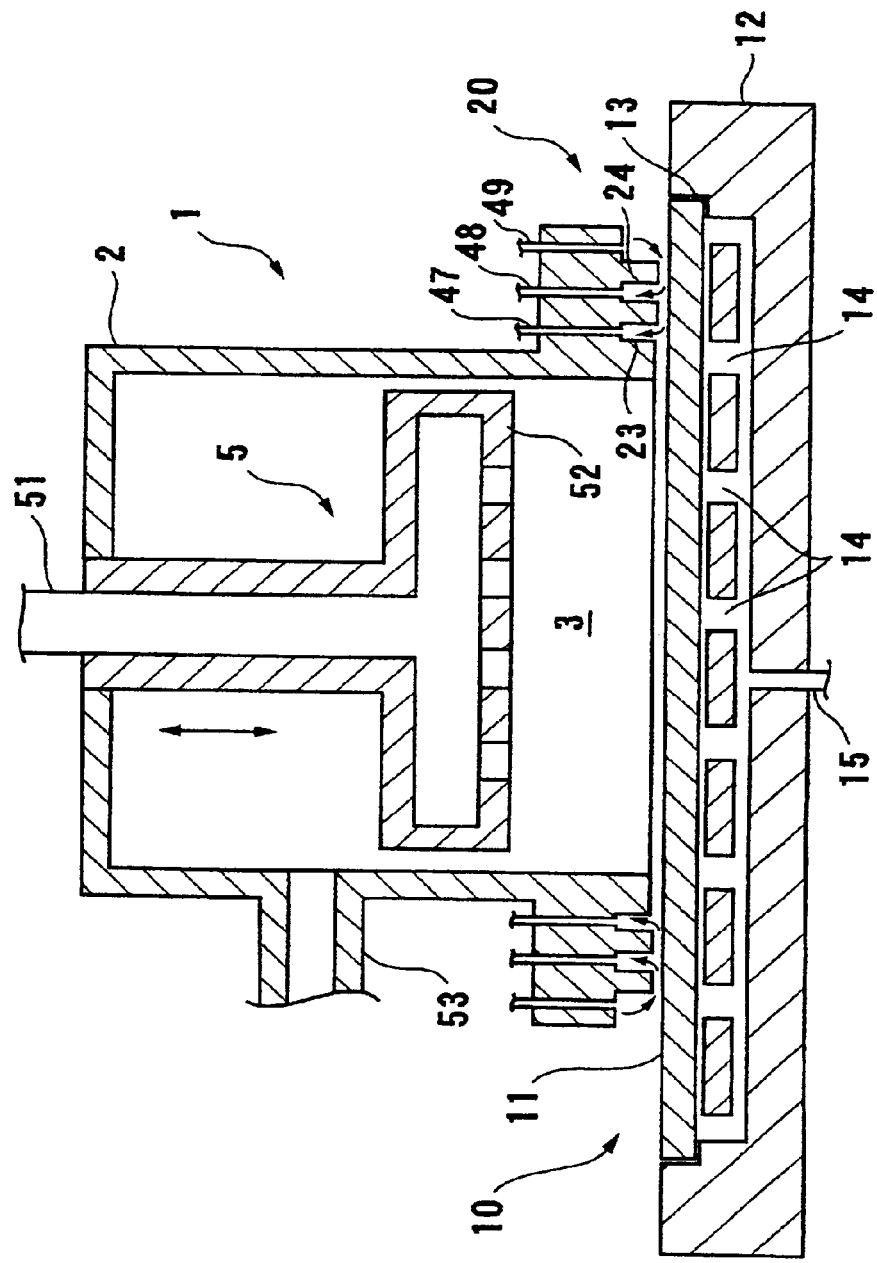
FIG. 6 is a schematic view showing an example of a processing apparatus having a CVD device according to an embodiment of the present invention.

5) Inspection processes for inspecting conditions of a surface, to be processed, of a workpiece FIG. 6 shows an example of a processing apparatus having a CVD device therein for depositing a thin film onto a surface, to be processed, of a workpiece such as a semiconductor wafer. As shown in FIG. 6, a workpiece 10 to be processed, such as a semiconductor wafer, is held by a workpiece holder 12 having a chucking mechanism and disposed under the workpiece. The workpiece holder 12 has a recess 13 defined in an upper surface thereof for receiving and holding the workpiece 10, and a plurality of communication holes 14 defined in the bottom of the recess 13. The communication holes 14 can be connected to and disconnected from a vacuum source (not shown) such as a vacuum pump via an exhaust passage 15. When the communication holes 14 are connected to the vacuum source via the exhaust passage 15, a negative pressure is developed at opening ends of the communication holes 14 to attract the workpiece 10 to the recess 13 of the workpiece holder 12.

As shown in FIG. 6, the processing apparatus 1 has a CVD device 5 in the process chamber 3. The CVD device 5 has a gas ejection head 52 at the lower end thereof for ejecting a deposition gas toward the workpiece 10 held by the workpiece holder 12. The gas ejection head 52 is connected to a material gas supply source (not shown) via a gas introduction passage 51. The cover 2 has an exhaust port 53 connected to a vacuum source (not shown) such as a vacuum pump. The interior of the process chamber 3 can be evacuated by the vacuum source, so that a vacuum condition having a given vacuum level required in the process is produced in the process chamber 3.

In this example, the sealing portion 4 comprises a differential pumping seal. The cover 2 has a support portion 20 having two recesses 23, 24 defined in the lower surface thereof. These recesses 23, 24 are connected to a vacuum source (not shown) via exhaust passages 47, 48. A vacuum level of the exhaust passage 47 is higher than the vacuum level of the exhaust passage 48. A gas supply passage 49 is formed in the support portion 20 at a radially outward position of the exhaust passage 48 and is connected to a gas supply source (not shown). A sealing gas (dry inert gas) such as $N_2$ or Ar is supplied through the gas supply passage 49 to the recesses 23, 24. The supplied sealing gas is exhausted via the exhaust passages 47, 48 to seal the interior of the process chamber 3 from the exterior space. Thus, the interior of the process chamber 3 is kept hermetically sealed.

In this example, the processing apparatus 1 may comprise a vacuum gauge for detecting a vacuum level in the process chamber 3, a vacuum gauge for detecting a vacuum level of the reverse side of the workpiece 10, i.e., a vacuum level in the recess 13, and a control device for controlling the pressure in the recess 13 so as to be equal to the pressure in the process chamber 3 during the process, based on the signals from the vacuum gauges. In this case, a differential pressure is not developed between the face side and the reverse side of the workpiece 10 in the process chamber 3, for thereby processing the workpiece 10 without deflection thereof. Since atmospheric pressure is applied to a portion of the workpiece 10 that is not covered by the cover 2, a differential pressure is developed between the face side and the reverse side of the workpiece 10 at the above portion. Therefore, the workpiece 10 can be attracted to the recess 13 of the workpiece holder 12 with this differential pressure. Although the details of the chucking mechanism are not shown in FIG. 6, the chucking mechanism may have a function of processing the workpiece 10 without deflection thereof, as described above.

With the processing apparatus 1 shown in FIG. 6, when a thin film is deposited on the surface 11, to be processed, of the workpiece 10, the deposition gas is supplied from the material gas supply source via the gas introduction passage 51 to the gas ejection head 52 in the process chamber 3 and then ejected from the gas ejection head 52 toward the workpiece 10 held by the workpiece holder 12. As a result, a thin film is deposited on the surface 11 of the workpiece 10.

Figure 7:
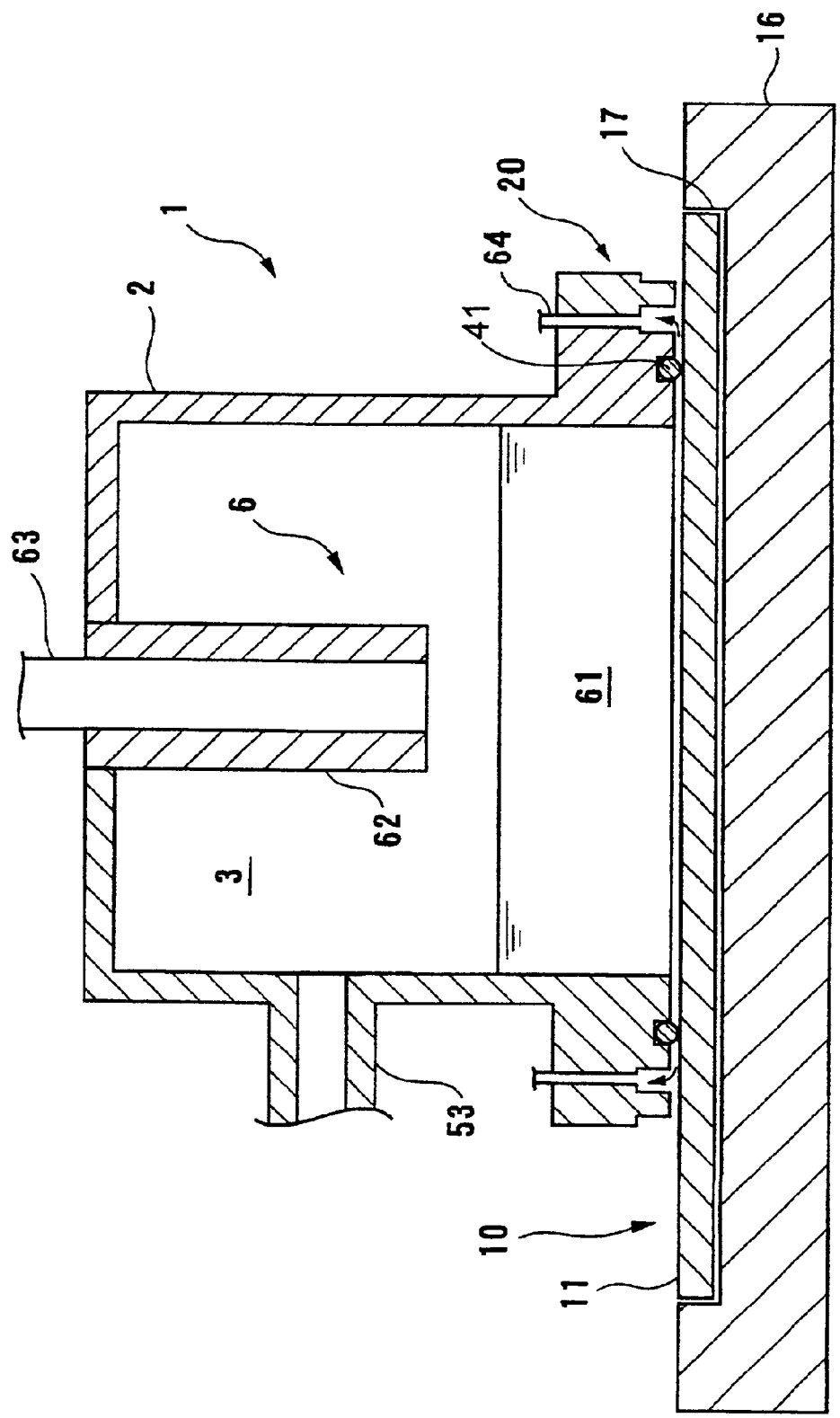
FIG. 7 is a schematic view showing an example of a processing apparatus having a chemical liquid cleaning device according to another embodiment of the present invention.

FIG. 7 shows an example of a processing apparatus having a chemical liquid cleaning device therein for cleaning a surface, to be processed, of a workpiece such as a semiconductor wafer with a chemical liquid. In FIG. 7, like parts and components are designated by the same reference numerals as those shown in FIG. 6, and will not be described below in detail.

As shown in FIG. 7, a workpiece 10 to be processed is held by a workpiece holder 16 having a recess 17 defined in an upper surface thereof. In a chemical liquid cleaning process, a chucking mechanism is not required in the workpiece holder 16 because an interior of the process chamber is not required to be evacuated. Therefore, in this illustrated example, the workpiece holder 16 has no chucking mechanism.

As shown in FIG. 7, the processing apparatus 1 comprises a chemical liquid cleaning device 6 in the process chamber 3. The chemical liquid cleaning device 6 has a chemical liquid supply nozzle 62 for supplying a chemical liquid 61 to the surface 11, to be processed, of the workpiece 10 held by the workpiece holder 16. The chemical liquid supply nozzle 62 is connected to a chemical liquid supply source (not shown) via a chemical liquid supply passage 63.

Cover 2 has a support portion 20 having an O-ring 41 as a contact seal. A chemical liquid suction passage 64 for sucking the chemical liquid 61 that leaks out of the an interior of the process chamber 3 is formed in the support portion 20 at a radially outward position of the O-ring 41. The chemical liquid suction passage 64 is connected to a vacuum source (not shown) such as a vacuum pump. Accordingly, the chemical liquid 61 that leaks out of the interior of the process chamber 3 near the chemical liquid suction passage 64 is sucked via the chemical liquid suction passage 64, so that the chemical liquid 61 in the process chamber 3 is prevented from leaking out to the exterior space. The chemical liquid suction passage 64 may be connected to the chemical liquid supply passage 63 to circulate and reuse the chemical liquid 61 that has been sucked via the chemical liquid suction passage 64.

With the processing apparatus 1 shown in FIG. 7, when the surface 11, to be processed, of the workpiece 10 is cleaned with a chemical liquid, the chemical liquid 61 is supplied to the surface 11, to be processed, of the workpiece 10 from the chemical liquid supply nozzle 62 and stored in the process chamber 3. As a result, the surface 11 of the workpiece 10 is cleaned with the chemical liquid 61 stored thereon.

Figure 8:
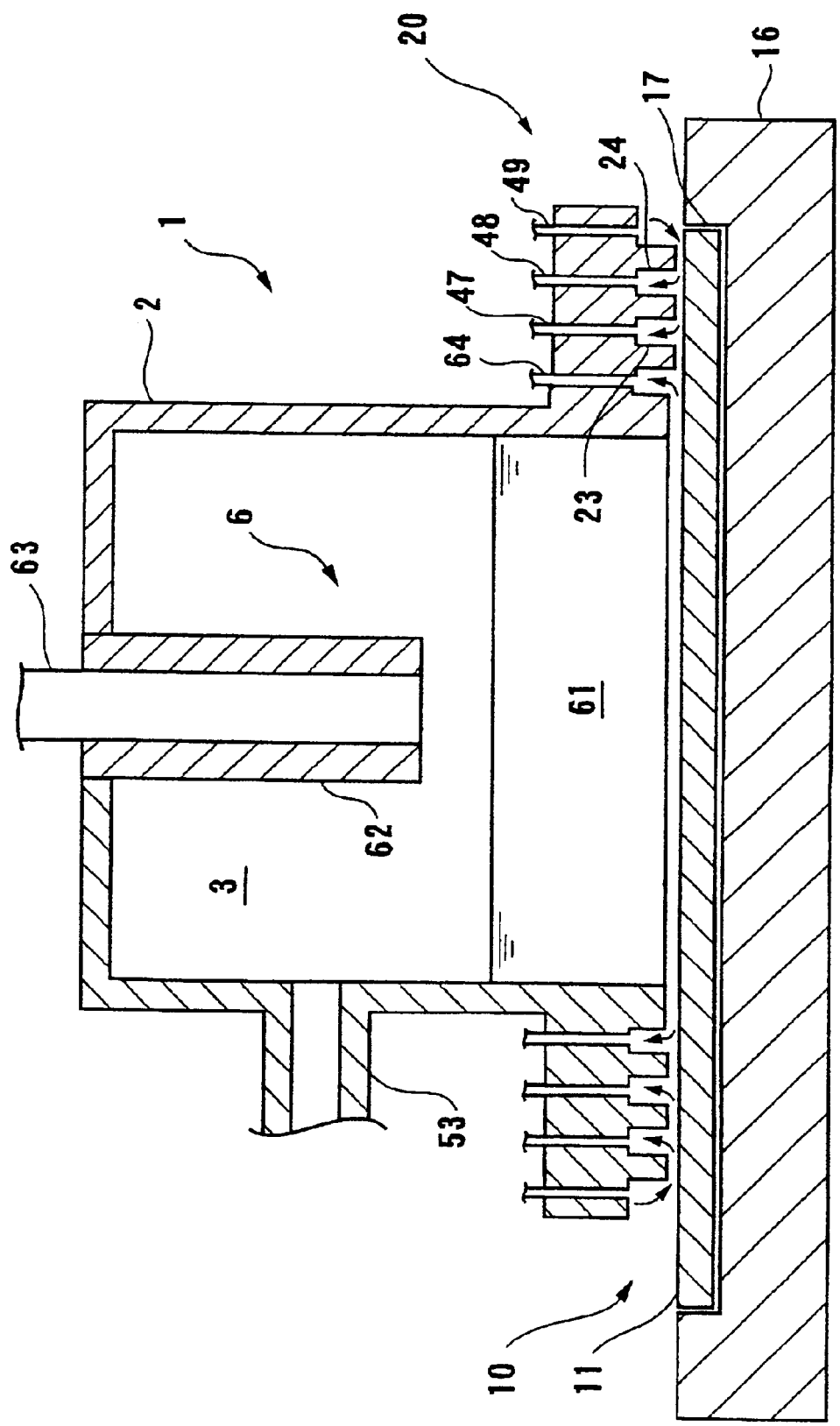
FIG. 8 is a schematic view showing an example of a processing apparatus having a chemical liquid cleaning device according to still another embodiment of the present invention.

In this example shown in FIG. 7, the sealing portion comprises the O-ring 41 serving as a contact seal. However, the sealing portion may comprise a differential pumping seal shown in FIG. 6. An example of a processing apparatus having a differential pumping seal as a sealing portion is shown in FIG. 8.

Various processing methods of a workpiece with use of the above processing apparatus will be described below.

Figure 9A:
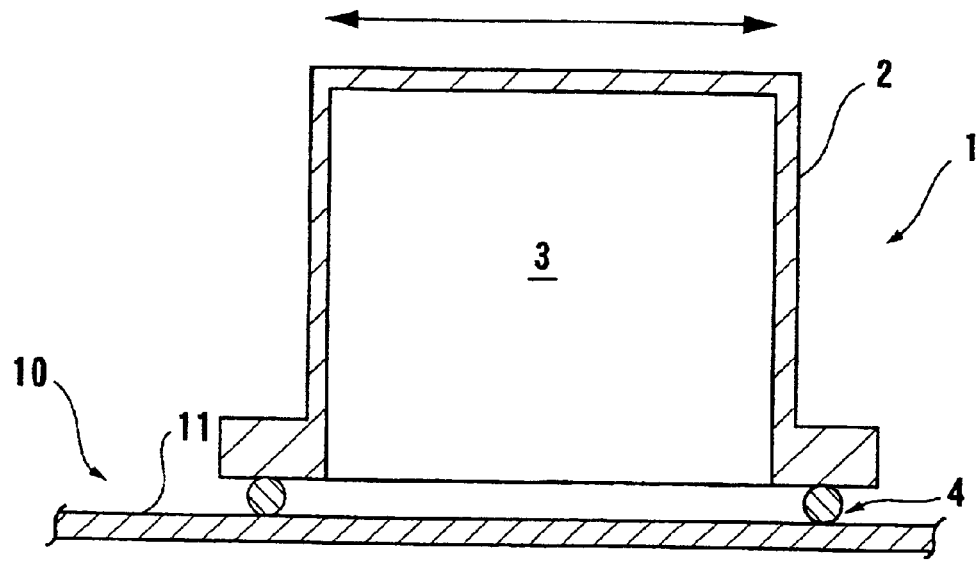
FIGS. 9A and 9B are schematic views explanatory of relative movement between a process chamber (processing apparatus) and a surface, to be processed, of a workpiece.
Figure 9B:
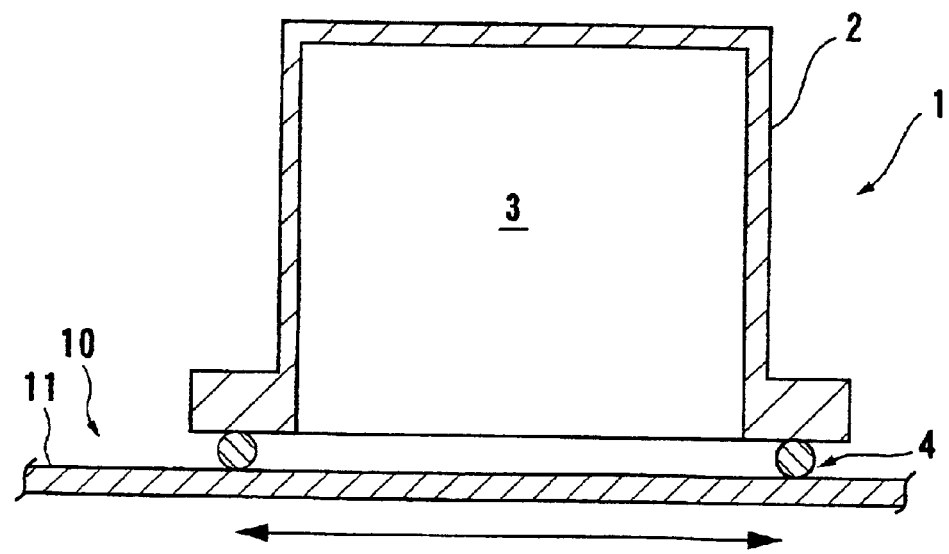

When the process chamber 3 is moved relatively to the surface 11, to be processed, of the workpiece 10, the whole surface of the workpiece 10 or only a desired area of the surface of the workpiece 10 can be processed. In this case, the process chamber 3 (processing apparatus 1) may be moved relatively to the surface 11 of the workpiece 10, as shown in FIG. 9A, or the workpiece 10 may be moved relatively to the process chamber 3 (processing apparatus 1), as shown in FIG. 9B. When the workpiece 10 is large in size, it is desirable that the process chamber 3 should be moved relatively to the surface 11 of the workpiece 10. In the case where the process chamber 3 (processing apparatus 1) is moved relatively to the surface 11 of the workpiece 10, a moving mechanism having a flexible tube (not shown), for example, is provided in the processing apparatus 1 for moving the process chamber 3. In the case where the workpiece 10 is moved relatively to the process chamber 3 (processing apparatus 1), a moving mechanism (not shown), such as an X-Y stage having a vibration control function, is provided in the processing apparatus 1 for moving the workpiece 10.

The process chamber 3 and the workpiece 10 may continuously be moved relative to each other, for continuously changing portions to be processed. Alternatively, after a specific portion of the surface 11 of the workpiece 10 is processed, the process chamber 3 and the workpiece 10 may intermittently be moved relatively to each other, for processing respective portions of the workpiece 10 one after another. When the process is completed, or when a portion to be processed is changed, the cover 2 may be moved upwardly by the aforementioned lifting/lowering mechanism.

Figure 10A:
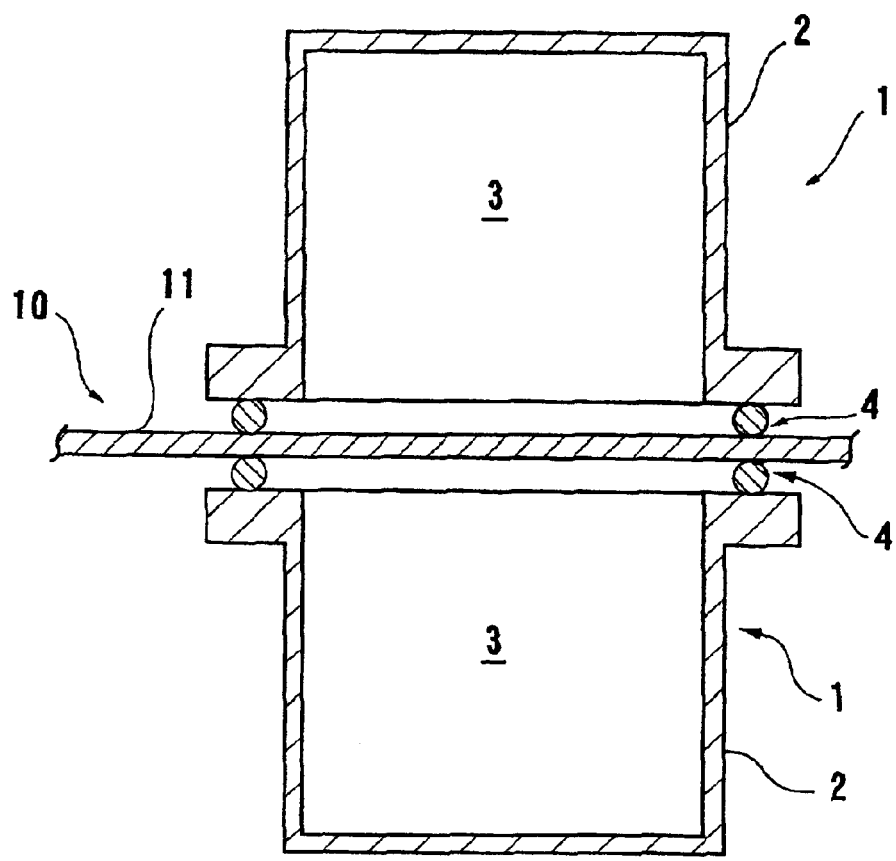
FIGS. 10A and 10B are schematic views explanatory of processing a plurality of surfaces, to be processed, of a workpiece with use of a plurality of processing apparatuses.
Figure 10B:
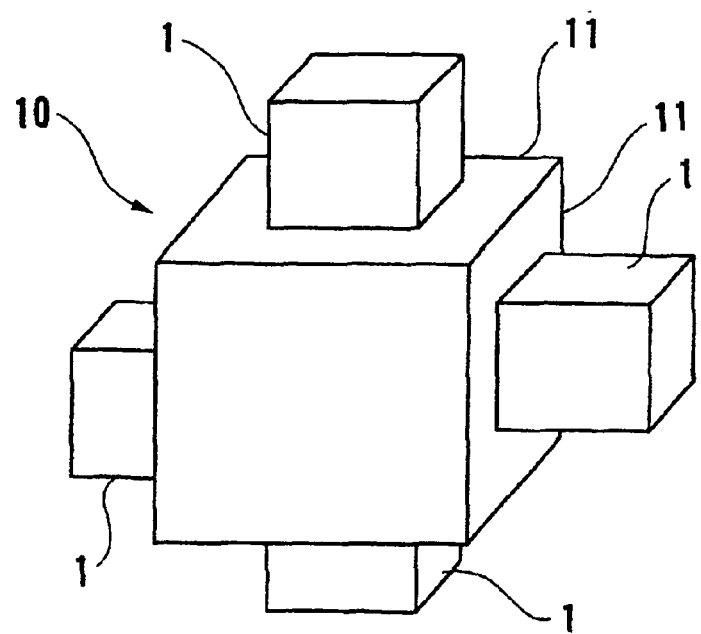

It is more effective to combine a plurality of processing apparatuses according to the present invention. For example, as shown in FIG. 10A, when two processing apparatuses 1 are disposed on both of a face side and reverse side of a workpiece 10, both of the face side and reverse side of the workpiece 10 can simultaneously be processed. FIG. 10B shows four processing apparatuses 1 disposed on an upper surface, lower surface, and right and left side surfaces of a workpiece 10. In FIG. 10B, the four surfaces of the workpiece 10 can simultaneously be processed. In this manner, a plurality of portions on a surface or surfaces of a workpiece can simultaneously be processed by combination of a plurality of processing apparatuses.

Figure 11:
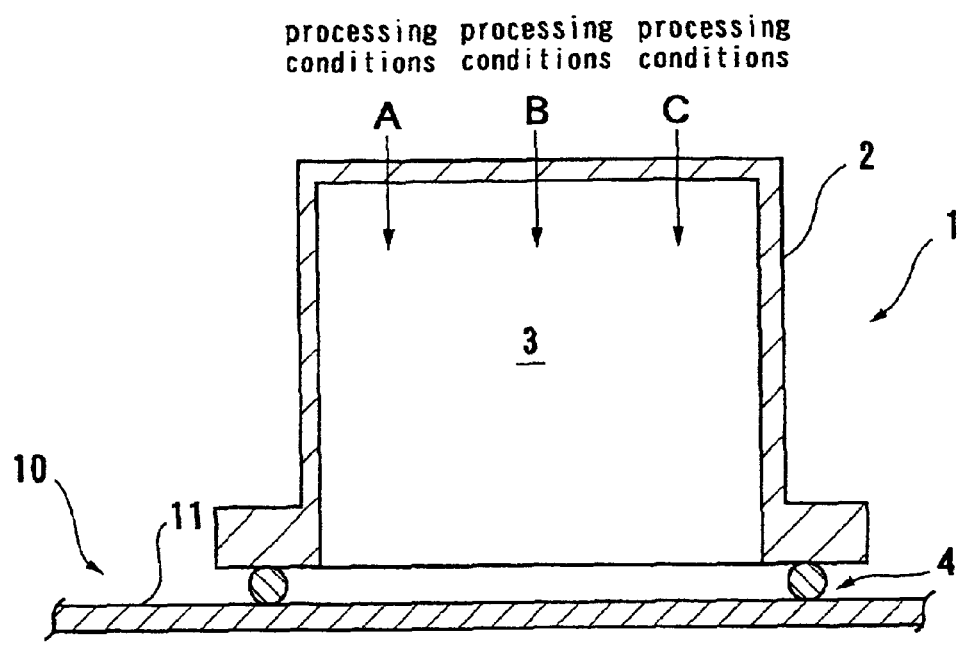
FIG. 11 is a schematic view explanatory of performing a plurality of processes in one process chamber.
Figure 12:
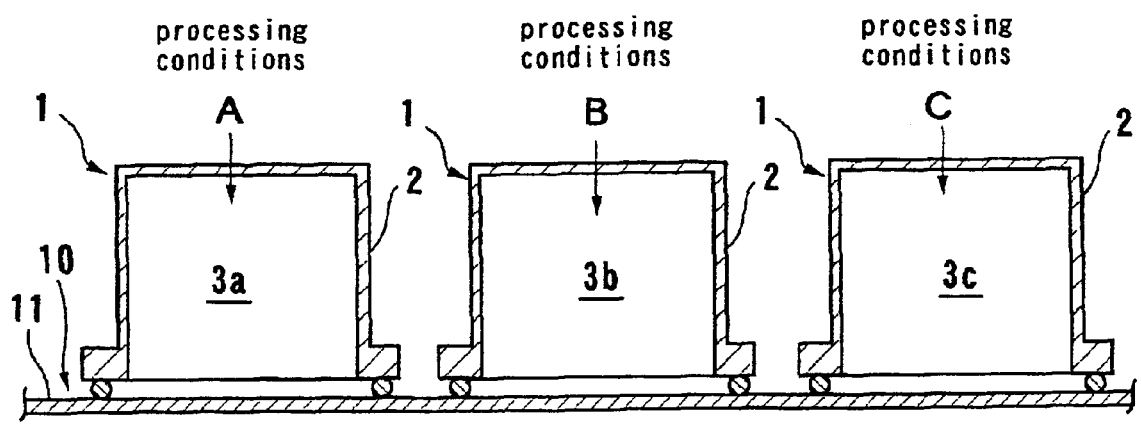
FIG. 12 is a schematic view explanatory of performing different processes in a plurality of process chambers.

With regard to processes performed in the process chamber 3, a plurality of processes are sequentially performed in one process chamber 3. For example, as shown in FIG. 11, when processing conditions are sequentially changed from A to B and then C, a plurality of processes can sequentially be performed in one process chamber 3. On the other hand, a plurality of processing apparatuses 1 may be used to perform different processes in the respective processing chambers 3. For example, as shown in FIG. 12, processes are performed under processing conditions A in the process chamber 3a, under processing conditions B in the process chamber 3b, and under processing conditions C in the process chamber 3c, respectively. Thus, a plurality of different processes can simultaneously be performed. A plurality of processing chambers shown in FIG. 11 that sequentially perform a plurality of processes may be disposed on a workpiece.

For example, as shown in FIG. 13, a processing apparatus 1a having a chemical liquid cleaning device, a processing apparatus 1b having a CVD device, and a processing apparatus 1c having an inspection device for inspecting a surface, to be processed, of a workpiece are disposed on a workpiece 10 such as a semiconductor wafer. These processing apparatuses 1a, 1b, 1c are moved relatively to the workpiece 10 continuously or intermittently. Thus, a series of processes can be performed on the surface of the workpiece 10. In FIG. 13, a series of processes including chemical liquid cleaning, thin film deposition, and inspection of a workpiece can simultaneously be performed.

In the case where different processes are performed in a plurality of process chambers 3 as described above, if periods of time required for the respective processes in the process chambers 3 are different from each other, then processing conditions are properly modified for respective process chambers 3 to control reaction rates in the respective process chambers 3. Thus, the periods of time required for the respective processes in the process chambers 3 can properly be adjusted.

Figure 14:
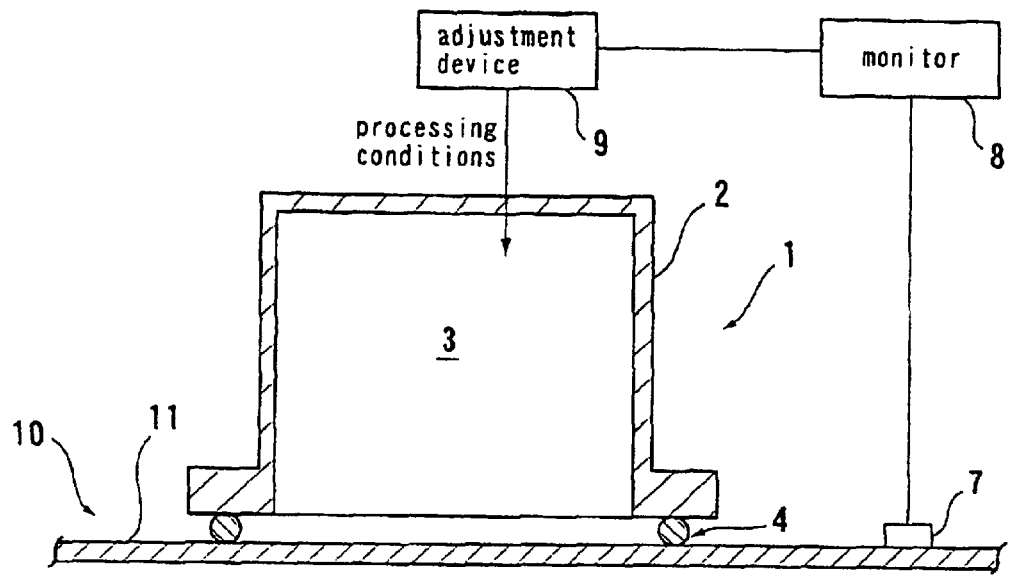
FIG. 14 is a schematic view showing a processing apparatus according to another embodiment of the present invention.
Figure 15:
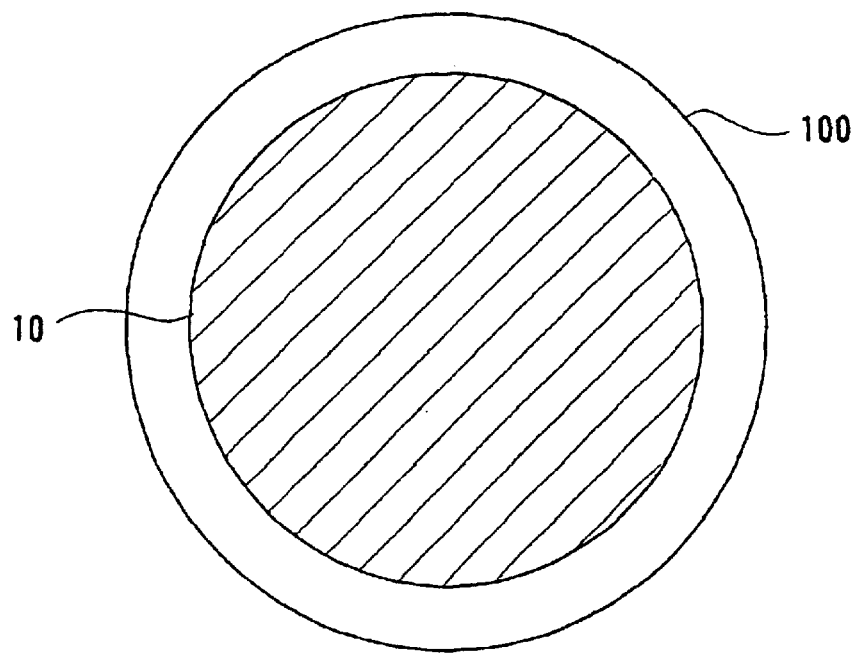
FIG. 15 is a conceptional plan view showing a relationship between a workpiece to be processed and a process chamber in a conventional processing apparatus.

FIG. 14 shows a processing apparatus having an inspection device for inspecting conditions of a surface of a workpiece. As shown in FIG. 14, a processing apparatus having a CVD device, a chemical liquid cleaning device, or the like may comprise a sensor 7 for detecting or measuring conditions of a surface, to be processed, of a workpiece, and a monitor 8 for monitoring the detecting or measuring results of the sensor 7. With this arrangement, conditions of the surface 11 of the workpiece 10 before or after the process can be detected for thereby diagnosing the process. Such diagnosis can be applied to a process for regenerating the surface 11 of the workpiece or removing a defective workpiece. As shown in FIG. 14, the processing apparatus may further comprise an adjustment device 9 for adjusting processing conditions in the process chamber 3 by feedback control based on a signal from the sensor 7. In this case, the surface 11 of the workpiece 10 can properly be processed based on the actual conditions of the surface 11 of the workpiece 10 before or after performance of the process.

A cleaning process and a drying process may be performed after performance of the above process (a process under vacuum, a process under atmospheric pressure, or a wet process) to prevent contamination on the workpiece. Therefore, it is easy to arrange a processing apparatus suitable for dry in dry out process in which the workpiece to be processed is introduced into the processing apparatus in a dry state and the processed workpiece is removed from the processing apparatus in a dry state.

As described above, according to the present invention, since a large process chamber is not required even in the case of a larger workpiece, the processing apparatus has a highly compact structure to reduce an installation space for the apparatus and an amount of a material required for the process.

Although certain preferred embodiments of the present invention have been shown and described in detail, it should be understood that various changes and modifications may be made therein without departing from the scope of the appended claims.

What is claimed is:

1. A processing apparatus for processing a workpiece, comprising:
   a cover for covering a portion of a surface, to be processed, of the workpiece;
   a process chamber to be formed by said cover and the surface, to be processed, of the workpiece; and
   a sealing portion at a lower end of said cover for sealing said process chamber when formed, said sealing portion to be provided between said cover and the surface of the workpiece so as to face the surface of the workpiece.

2. The processing apparatus according to claim 1, wherein said sealing portion comprises at least one of a contact seal and a non-contact seal.

3. A processing apparatus for processing a workpiece, comprising:
   a cover for covering a portion of a surface, to be processed, of the workpiece;
   a process chamber to be formed by said cover and the surface, to be processed, of the workpiece, and
   a sealing portion to be provided between said cover and the surface of the workpiece for sealing said process chamber when formed, said sealing portion comprising at least one of a contact seal and a non-contact seal,
   wherein said contact seal comprises at least one of an O-ring and an oil seal.

4. A processing apparatus for processing a workpiece, comprising:
   a cover for covering a portion of a surface, to be processed, of the workpiece;
   a process chamber to be formed by said cover and the surface, to be processed, of the workpiece; and
   a sealing portion to be provided between said cover and the surface of the workpiece for sealing said process chamber when formed, said sealing portion comprising at least one of a contact seal and a non-contact seal,
   wherein said non-contact seal comprises at least one of a magnetic fluid seal and a differential pumping seal.

5. A processing apparatus for processing a workpiece, comprising:
   a cover for covering a portion of a surface, to be processed, of the workpiece;
   a process chamber to be formed by said cover and the surface, to be processed, of the workpiece;
   a sealing portion to be provided between said cover and the surface of the workpiece for sealing said process chamber when formed; and
   a chemical vapor deposition device in said process chamber, when formed, for depositing a thin film on the surface of the workpiece.

6. A processing apparatus for processing a workpiece, comprising:
   a cover for covering a portion of a surface, to be processed, of the workpiece;
   a process chamber to be formed by said cover and the surface, to be processed, of the workpiece;
   a sealing portion to be provided between said cover and the surface of the workpiece for sealing said process chamber when formed; and
   a chemical liquid cleaning device in said process chamber, when formed, for cleaning the surface of the workpiece with a chemical liquid.

7. A processing apparatus for processing a workpiece, comprising:
   a cover for covering a portion of a surface, to be processed, of the workpiece;
   a process chamber to be formed by said cover and the surface, to be processed, of the workpiece; and
   a sealing portion to be provided between said cover and the surface of the workpiece for sealing said process chamber when formed; and
   a sensor for detecting conditions of the surface of the workpiece.

8. The processing apparatus according to claim 7, further comprising an adjustment device for adjusting processing conditions in said process chamber, when formed, based on a signal from said sensor.

9. A processing apparatus for processing a workpiece, comprising:
   a cover for covering a portion of a surface, to be processed, of the workpiece;
   a process chamber to be formed by said cover and the surface, to be processed, of the workpiece; and
   a sealing portion to be provided between said cover and the surface of the workpiece for sealing said process chamber when formed, wherein the surface of said workpiece is to be processed under a pressure lower than atmospheric pressure.

10. A processing apparatus for processing a workpiece, comprising:

a cover for covering a portion of a surface, to be processed, of the workpiece;

a process chamber to be formed by said cover and the surface, to be processed, of the workpiece; and a sealing portion to be provided between said cover and the surface of the workpiece for sealing said process chamber when formed, wherein the surface of the workpiece is to be processed under a wet condition.

* * * * *